US006642779B2

(12) United States Patent
Easwaran et al.

(10) Patent No.: US 6,642,779 B2
(45) Date of Patent: Nov. 4, 2003

(54) TRIMMING IMPEDANCE BETWEEN TWO NODES CONNECTED TO A NON-FIXED VOLTAGE LEVEL

(75) Inventors: Prakash Easwaran, Bangalore (IN); Sandeep Oswal, Bangalore (IN); Naom Chaplik, San Diego, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/080,535

(22) Filed: Feb. 25, 2002

(65) Prior Publication Data

US 2003/0160647 A1 Aug. 28, 2003

(51) Int. Cl.[7] .............................. H03B 5/20; H04B 1/12
(52) U.S. Cl. ........................ 327/553; 327/308; 333/17.3
(58) Field of Search ................................. 327/308, 311, 327/552–559; 379/347, 394, 398; 333/17.3, 172; 326/30

(56) References Cited

U.S. PATENT DOCUMENTS 3,798,572 A * 3/1974 Weiss ..................... 331/108 D
3,946,328 A * 3/1976 Boctor ....................... 327/553
4,683,386 A * 7/1987 Kamikawara ............... 327/308
5,880,634 A * 3/1999 Babanezhad ................ 327/557
5,910,906 A * 6/1999 Schmitt ...................... 379/372
6,097,244 A * 8/2000 Chen .......................... 327/553
6,459,404 B1 * 10/2002 Nussbaum et al. ......... 327/106

* cited by examiner

Primary Examiner—Timothy P. Callahan
Assistant Examiner—Terry L. Englund
(74) Attorney, Agent, or Firm—April M. Mosby; Wade James Brady, III; Frederick J. Telecky, Jr.

(57) ABSTRACT

A T-network containing three impedances is provided between two terminating ends connected to a non-fixed voltage level. Two impedances are connected in series between the two terminating ends. A third impedance is connected between the junction of the first two impedances and a fixed voltage. Switches may be used to trim the third impedance, thus obtaining a desired voltage between the two terminating ends. A terminal of any switches used for trimming can be connected to the fixed voltage node, thereby ensuring that the impedance introduced by the switches does not change substantially during different operating situations.

1 Claim, 3 Drawing Sheets

TRIMMING IMPEDANCE BETWEEN TWO NODES CONNECTED TO A NON-FIXED VOLTAGE LEVEL

BACKGROUND OF THE INVENTION

1. Field of the Invention

The present invention relates to filters, and more specifically to a method and apparatus for implementing desired impedance between two nodes or ends that are connected to a non-fixed voltage level.

2. Related Art

Filters are generally implemented to perform corresponding transfer functions as is well known in the relevant arts. A transfer function is determined by, among other aspects, the impedances used to implement the corresponding filter as is also well known in the relevant arts.

Accordingly, it is generally desirable that components be implemented to attain a desired impedance (within an acceptable tolerance limit) between the two ends ("terminating ends") of the impedance. However, due to reasons such as manufacturing process imperfections, it is often difficult to implement components with the desired impedances.

In a prior approach known as trimming, a large impedance substantially equaling the desired impedance, may be used in conjunction with several incremental impedances. Switches may be used to selectively activate only some of the incremental impedances to attain a desired impedance across the terminating ends.

It may be desireable to provide the ability to trim impedances having terminating ends, wherein the terminating ends couple to a non-fixed voltage level while meeting several other requirements (such as ensuring that the implemented component continues to operate within an acceptable impedance range in several operation situations). Such ability would generally increase the design choices for a designer implementing a solution.

Accordingly, what is needed is a method and apparatus which enables an impedance (or the impedance of a component) to be trimmed when neither terminating end is connected to ground.

SUMMARY OF THE INVENTION

The present invention allows a desired impedance, which does not change substantially in different operating situations, to be implemented between two terminating nodes not connected to the ground. The desired impedance may be obtained by using a T-network between the two nodes.

The T-network may contain three impedances, with the first two impedances being connected in series between the two terminating nodes. One terminal of the third impedance may be connected to a fixed voltage (such as ground), and the other terminal may be connected to the junction of the first two impedances. Assuming the three impedances are represented by ZA, ZB, and ZC, the impedance between the two terminating nodes equals: ZA+ZB+(ZA×ZB/ZC), as is well known in the relevant arts.

Thus, impedance ZC can be trimmed to obtain a desired impedance between the two terminating ends. In addition, a terminal of the switches used for trimming may be connected to a fixed voltage such that the resistance introduced by the switches remains substantially the same in many operating situations. Accordingly, the voltage between the terminating ends may remain substantially unaltered during operation.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

The present invention enables a desired impedance to be attained (in a filter) in different operating situations across two terminating ends (neither of which is connected to ground). The feature is obtained by using a T-network containing three impedances. Two impedances may be connected in series across the terminating ends. One terminal of a third impedance is connected to the junction connecting the two impedances and the other terminal (of the third impedance) is connected to a point with a fixed voltage level (e.g. ground), The third impedance in the T-network may be implemented using several incremental impedances, with switches connected across each incremental impedance. By selectively activating only some of the incremental impedances in the third impedance, the desired impedance may be attained between the terminating ends.

In addition, the impedance introduced by the switches may not change substantially as one terminal of the switch may be connected to a fixed voltage. As a result, the impedance between two terminating ends coupled to a non-fixed voltage level may be within an acceptable range during different operating situations.

It is useful to understand an example filter to appreciate several aspects of the present invention. Accordingly, an example filter is described first. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Filter

Figures 1, 2A:
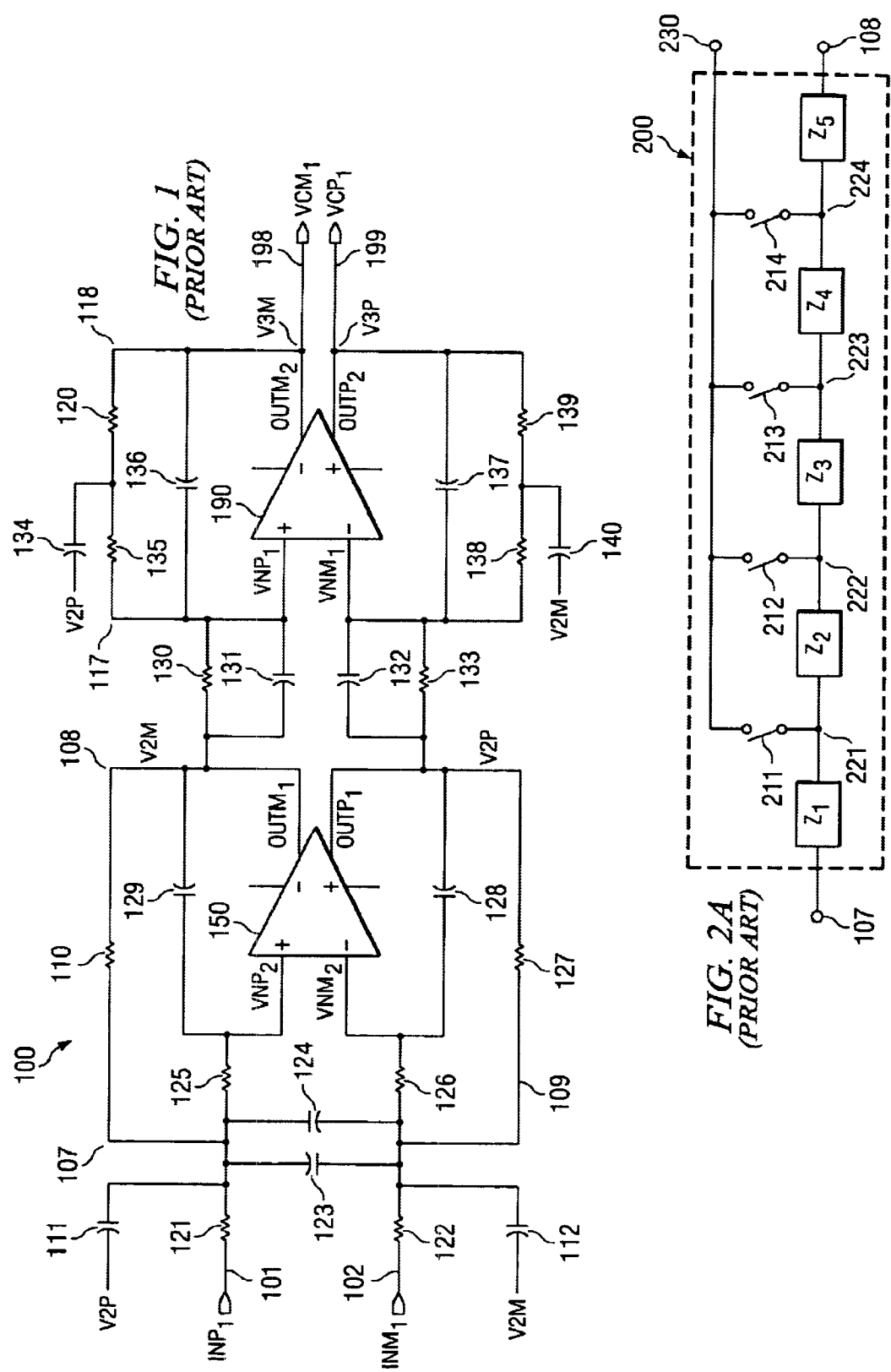
FIG. 1 is a block diagram illustrating the details of an embodiment of a filter.
FIG. 2A is a block diagram illustrating the details of a impedance network implement according to a prior approach.

FIG. 1 is a block diagram illustrating the details of an embodiment of filter 100. Filter 100 may be implemented to perform a transfer function of $\{(1+c0*s^{\wedge}2)/((1+a1*s+a2*s^{\wedge}2)*(1+b1*s+b2*s^{\wedge}2)\}$, wherein $^{\wedge}2$ represents a square operation, s is a frequency variable, and c0, a1, a2, b1, b2 are filter coefficients.

Conventional filter 100 is shown containing operational amplifiers (OPAMP) 150 and 190 and several impedances (resistors and capacitors). Specifically, positive and negative input nodes, $INP_1$ and $INM_1$, of circuit 100 couple to resistors 121 and 122, respectively. Voltages V2P and V2M couple to capacitors 111 and 112, respectively. Resistor 121 and capacitor 111 coupled together to form node 107. Resistor 122 and capacitor 112 coupled together to form node 109. A pair of capacitors, 123 and 124, couple in parallel between nodes 107 and 109. Resistor 125 couples between node 107 and the positive input $INP_2$ of OPAMP 150. Resistor 126 couples between node 109 and the negative input $INM_2$ of OPAMP 150. The positive and negative output nodes, $OUTP_1$ and $OUTM_1$, of OPAMP 150 couple to form nodes V2P and V2M, respectively. Capacitor 129 couples between nodes INP2 and V2M. Resistor 110 couples between node V2M and node 107. Capacitor 128 couples between nodes INM2 and V2P. Resistor 127 couples between node V2P and node 109. Resistor 130 and capacitor 131 couple in parallel between node V2M and input node VNP1 of OPAMP 190. Similarly, resistor 132 and capacitor 133 couple in parallel between node V2P and input node VNM1 of OPAMP 190. The positive and negative output nodes, $OUTP_2$ and $OUTM_2$, of OPAMP 190 couple to form nodes V3P and V3M, or output leads, 199 and 198, respectively. Capacitor 136 couples as feedback between nodes V3M and VNP1. Resistors 135, 120 and capacitor 134 couple between nodes V3M and VNP1 wherein capacitor 134 couples to voltage node V2P. Capacitor 137 couples as feedback between nodes V3P and VNM1. Resistors 138, 139 and capacitor 140 couple between nodes V3P and VNM1 wherein capacitor 140 couples to voltage node V2M. Filter 100 performs the transfer function on an input signal received on lines 101 and 102, and forwards the resulting output signal on lines 198 and 199.

To obtain the desired transfer function, it is often required to implement a desired impedance in various places in filter 100. For example, impedance 110 between terminating ends 107 and 108 may be required to be within an acceptable range. Similarly, between terminating ends 117 and 118, impedance 120 may be required to be within another acceptable range. A prior approach of implementing desired impedances is described below with reference to FIG. 2A.

3. Prior Approach of Implementing Impedances

FIG. 2A is a block diagram illustrating the manner in which impedance 110 may be implemented according to a prior approach. Impedance network 200 is shown containing impedances Z1, Z2, Z3, Z4 and Z5, and switches 211 through 214. A first terminal of switches 211–214 is respectively connected to a corresponding one of junctions 221–224 respectively. The second terminal of switches 211–214 are together connected to common node 230 in the filter.

Impedance Z1 may substantially equal the desired impedance ($Z_{Des}$) across terminating ends 107 and 108. Z2–Z5 may be referred to as incremental impedances. Switches 211–214 may be used to selectively activate (turn ON) only some of the incremental impedances. The activated impedances along with impedance Z1 operate to effectively provide the desired impedance across terminating ends 107 and 108. Thus, any variances resulting from manufacturing processes may be corrected by appropriate choice of impedance Z1. A problem with the prior approach is noted below.

4. Problem with Prior Approach

One problem with impedance network 200 of FIG. 2A is that the impedance introduced by each switch depends on the voltage across the corresponding junction and common node 230. For example, the impedance of switch 211 depends on the voltage across junction 221 and common node 230.

Large voltage swings across switches can cause the impedance between two terminating ends 107 and 108 to change substantially. As a result, the impedance between two terminating ends 107 and 108 may not be within an acceptable range during different operating situations.

One way to minimize such a problem is to connect one terminal of the switch to a fixed voltage level. Thus, it would be desirable to connect common node 230 to a node where there is minimal voltage swing (for example, ground). However, if neither of the terminating nodes are at a constant voltage level, such a connection may not be available. The present invention provides such an ability to connect switches to ground as described below with reference to FIG. 2B.

5. Present Approach

Figure 2B:
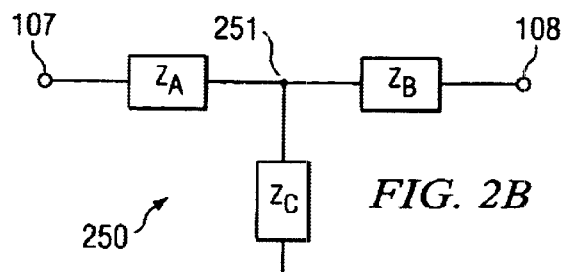
FIG. 2B is a block diagram illustrating the details of a T-network implemented in accordance with an aspect of the present invention.

FIG. 2B is a block diagram illustrating the details of T-network 250 which enables a desired impedance ($Z_{Des}$) to be implemented in accordance with the present invention. T-network 250 is shown containing impedances ZA, ZB and ZC. Each impedance ZA–ZC can be implemented using several impedances connected appropriately.

Impedances ZA and ZB are connected in series between terminating ends 107 and 108. Impedance ZC is connected between junction 251 (connecting impedances ZA and ZB) and point 271. Point 271 is connected to a fixed voltage level such as ground (having zero voltage). The impedance 'Z' between terminating ends 107 and 108 is represented by the following equation:

$$Z=ZA+ZB+(ZA*ZB)/ZC \qquad \text{Equation (1)}$$

Thus, a desired impedance ($Z_{Des}$) may be attained by designing ZC with an appropriate impedance value. In addition, as one terminal of ZC is connected to ground (fixed voltage) terminal, ZC may be implemented not to vary substantially in different operating situations as described below.

6. Impedance ZC

Figure 3:
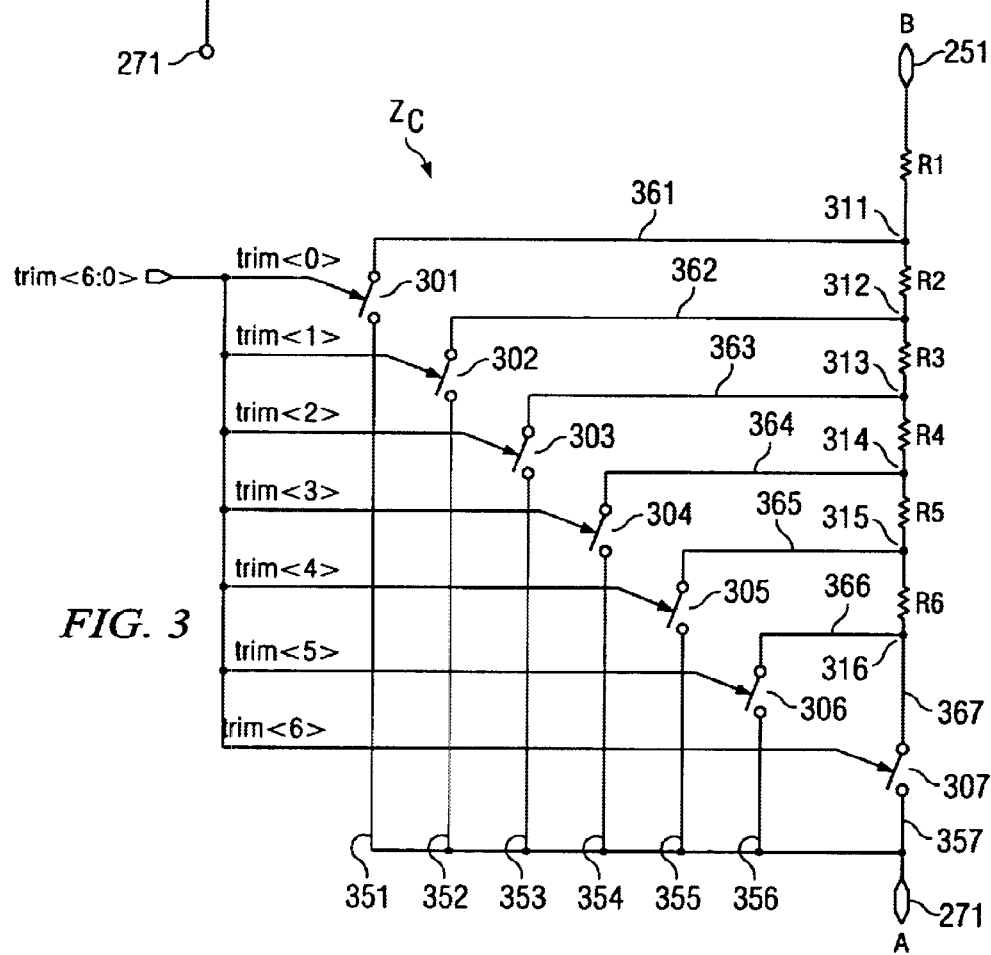
FIG. 3 is a circuit diagram illustrating the manner in which one of the impedances in a T-network is implemented according to an aspect of the present invention.

FIG. 3 is a block diagram illustrating the details of an embodiment of impedance ZC implemented in accordance with the present invention. Impedance ZC is shown containing switches 301 through 307 and resistors R1 through R6. Resistors R1–R6 are connected in series. Terminals 351–357 of all switches 301–307 are connected to point 271 and each of the terminals 361–367 of switches 301–307 is connected to a respective one of junctions 311 through 316. Point 271 may be at a fixed voltage.

Only those resistors R1–R6 required to make Z of Equation (1) equal to the desired impedance ($Z_{Des}$) are activated by turning on the corresponding switches 301–307. For example, if resistors R1–R5 are required to be connected to impedance ZA and ZB, then switch 305 is closed (or switched on). In such a scenario, impedance ZC equals the sum of resistance of resistors R1–R5.

In addition, because terminals 351–357 are at a fixed voltage level, the voltage across switches 301–307 would be predictable in many operating situations. As a result, the impedance introduced by switches 301–307 remains substantially unchanged in different operating situations. Thus, the impedance ZC and z (of Equations (1)) remain substantially unchanged.

It must be understood that though ZC is shown implemented using resistors, ZC may be implemented using other elements such as capacitors as well. The manner in which T-network 250 may be used is described with reference to FIG. 4.

7. Re-designed Filter

Figure 4:
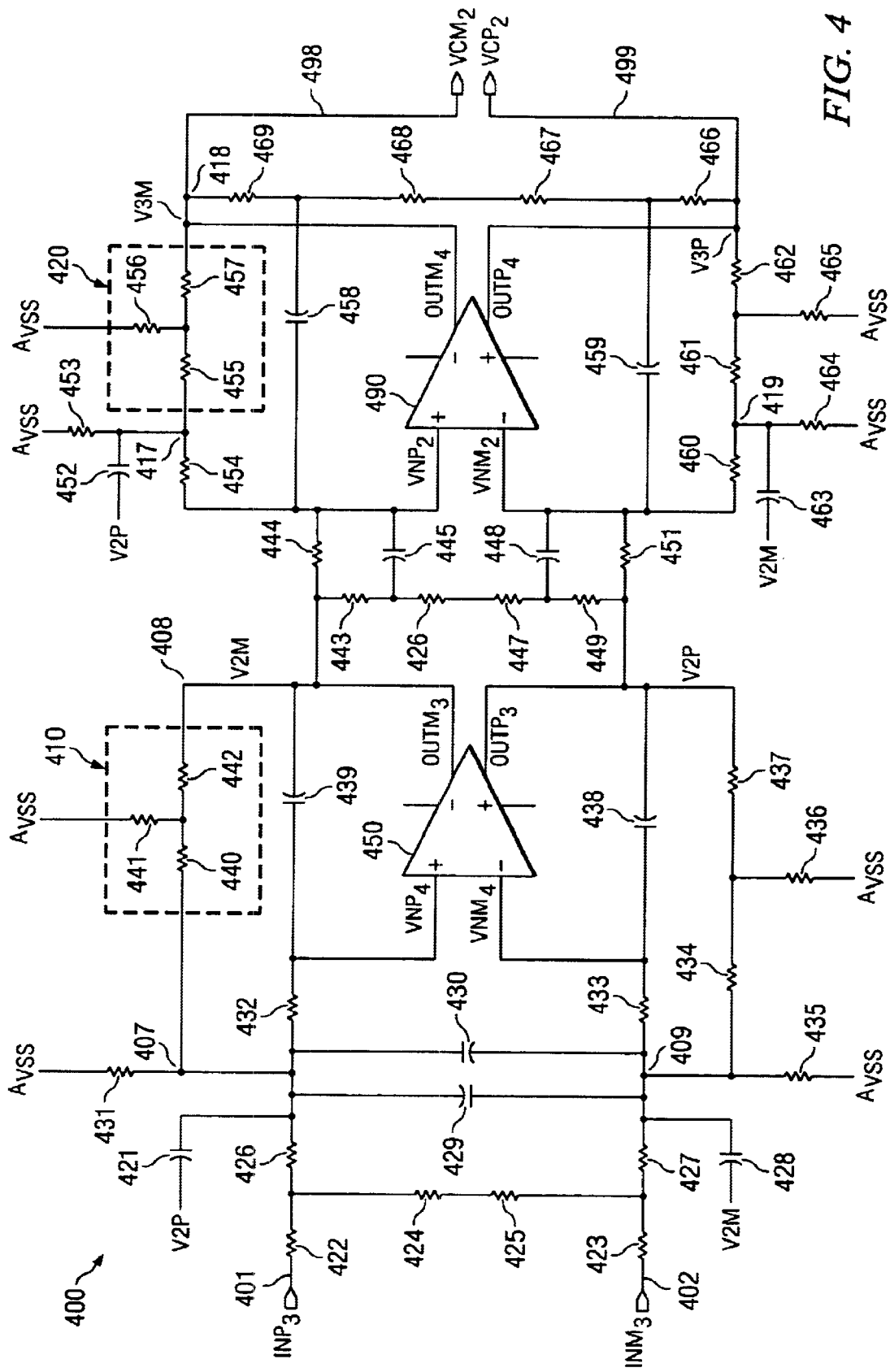
FIG. 4 is a block diagram illustrating the details of a re-designed filter.

FIG. 4 is a block diagram of the details of an example filter 400 illustrating the manner in which T-network 250 (officer 2B) may be used. It may be appreciated filter 400 is similar to filter 100 (of FIG. 1) in many respects, except that some impedances are shown implemented using equivalent T-networks. Thus, filter 400 provides the same transfer function as filter 100.

Filter 400 is shown containing operational amplifiers (OPAMP) 450 and 490 and several impedances (resistors and capacitors). Specifically, positive and negative input nodes, $INP_3$ and $INM_3$, of circuit 400 couple to resistors 422 and 423, respectively. Voltages V2P and V2M couple to capacitors 421 and 428, respectively, to form nodes 407 and 409. Resistors 424 and 425 coupled in series between resistors 422 and 423. Resistor 426 couples between resistor 422 and capacitor 421. Resistor 427 couples between resistor 423 and capacitor 428. A pair of capacitors, 429 and 430, couple in parallel between nodes 407 and 409. Resistor 432 couples between node 407 and the positive input $INP_4$ of OPAMP 450. Resistor 433 couples between node 409 and the negative input $INM_4$ of OPAMP 450. The positive and negative output nodes, $OUTP_3$ and $OUTM_3$, of OPAMP 450 couple to form nodes V2P and V2M (408), respectively. Capacitor 439 couples between nodes $INP_4$ and V2M. Resistors 440, 441 and 442 couples to form T-network 410 between nodes V2M and node 407. Resistor 431 couples between voltage supply AVSS and node 407. Capacitor 438 couples between nodes $INM_4$ and V2P. Resistors 434, 436 and 437 couple to form T-network 410 between node V2P and node 409. Resistor 435 couples between voltage supply AVSS and node 409. Resistor 444 couples between node V2M and the positive input node $VNP_2$ of OPAMP 490. Resistor 443 couples to node V2M. Capacitor 445 couples between resistor 443 and positive input node $VNP_2$ of OPAMP 490. Resistor 451 couples between node V2P and the negative input node VNM2 of OPAMP 490. Resistor 449 couples to node V2P. Capacitor 448 couples between resistor 449 and negative input node VNM2 of OPAMP 490. Resistors 446 and 447 couple in series between resistors 443 and 449. The positive and negative output nodes, $OUTP_4$ and $OUTM_4$, of OPAMP 490 couple to form nodes V3P and V3M, respectively. Resistors 455, 456 and 457 couple to form T-network 420 between nodes V3M and 417, wherein resistor 456 couples to voltage supply AVSS. Resistor 453 couples between supply voltage AVSS and node 417. Capacitor 452 couples between node V2P and 417. Resistor 454 couples between node 417 and $VNP_2$. Resistor 469 couples to node 418. Capacitor 458 couples as feedback between resistor 469 and $VNP_2$. Resistors 461, 462 and 465 couple to form a T-network between nodes V3P and 419, wherein resistor 465 couples to voltage supply AVSS. Resistor 464 couples between supply voltage AVSS and node 419. Capacitor 463 couples between node V2M and 419. Resistor 460 couples between node 419 and $VNM_2$. Resistor 466 couples to node 499. Capacitor 459 as feedback between resistor 466 and VNM. Resistors 468 and 467 couple in series between resistors 469 and 466. Nodes 498 and 499 couple to provide output for circuit 400 at nodes VCM2 and VCP2, respectively. Input signals are provided to OPAMP 450 on lines 401 and 402 and the output signals are obtained on lines 498 and 499 of OPAMP 490, respectively.

T-network 410 is implemented between terminating ends 407 and 408. Similarly, T-network 420 is implemented between terminating ends 417 and 418. It may be appreciated that terminating ends 407 and 408 are similar to terminating ends 107 and 108. By implementing T-network 410, a desired impedance (which does not change substantially) may be obtained between terminating ends 407 and 408 which was not attainable between terminating ends 107 and 108 of filter 100. Similarly, T-network 420 may be implemented between terminating ends 417 and 418.

As the present invention enables a desired impedance to be implemented between two terminating end points not connected to ground, the present invention allows several designs to perform the same transfer function. The description is continued with reference to an example system in which filter 400 can be implemented.

8. Example System

Figure 5:
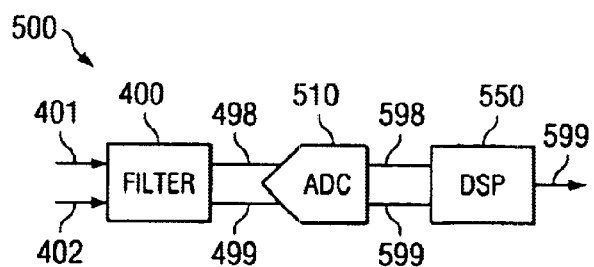
FIG. 5 is a block diagram illustrating the details of a system in which the present invention is implemented.

FIG. 5 is a block diagram illustrating the details of an embodiment of system 500 in which the present invention may be implemented. System 500 is shown containing filter 400, analog to digital convertor (ADC) 510 and digital signal processor (DSP) 550. Each component is described in further detail below.

Filter 400 performs a corresponding transfer function on input signal received on path 401–402, and provides the resulting output signal on lines 498 and 499 to ADC 510. Filter 400 may be implemented as described above.

Analog to digital convertor (ADC) 510 converts (samples) analog output signals received on lines 498 and 499 to corresponding digital samples, and provides the samples on lines 598 and 599 respectively. DSP 550 processes the digital signals to generate the desired output on line 599.

It may be appreciated that the present invention may be implemented in several types of environments. Examples of such environments include, but not limited to, digital subscribers loop (DSL) environments, Etheroop, HPNA, wide and local area networks (WLAN), etc.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A filter, having a positive input, a negative input, a positive output and a negative output, for processing an input signal comprising:
   a first operational amplifier (OPAMP) having a first positive OPAMP input, a first negative OPAMP input, a first positive OPAMP output and a first negative OPAMP output, wherein the first positive OPAMP output provides a first positive voltage supply and the first negative OPAMP output provides a first negative voltage supply;
   a positive input circuit portion, wherein the positive input circuit portion comprises,
      a first resistor coupled to the positive input of the filter,
      a second resistor coupled in series to the first resistor to form a node between the first and second resistors,
      a third resistor coupled to the node between the first and second resistors, and
      a first capacitor coupled between the first positive voltage supply and the second resistor;
   a negative input circuit portion, wherein the negative input circuit portion comprises, a fourth resistor coupled to the negative input of the filter, a fifth resistor coupled in series to the fourth resistor to form a node between the fourth and fifth resistors, a sixth resistor coupled to the node between the fourth and fifth resistors, wherein the sixth resistor couples to the third resistor, and a second capacitor coupled between the first negative voltage supply and the fifth resistor;

a third capacitor and a fourth capacitor coupled in parallel between the second and fifth resistors;

a seventh resistors coupled between the second resistor and the first positive OPAMP input;

an eighth resistor coupled between the fifth resistor and the first negative OPAMP input;

a fifth capacitor coupled between the first negative OPAMP output and the first positive OPAMP input to provide feedback;

a first T-network having a ninth resistor, a tenth resistor, and an eleventh resistor, wherein the ninth resistor and the tenth resistor are connected in series between two nodes that are connected to a non-fixed voltage level between the first negative voltage supply and the second resistor, the ninth and tenth resistors coupled to form a first junction, the eleventh resistor coupled between the first junction and a voltage supply source;

a twelfth resistor coupled between the voltage supply source and the tenth resistor;

a sixth capacitor coupled between the first positive OPAMP output and the first negative OPAMP input to provide feedback;

a second T-network having a thirteenth resistor, a fourteenth resistor, and a fifteenth resistor, wherein the thirteenth resistor and the fourteenth resistor are connected in series between two nodes that are connected to a non-fixed voltage level between the first positive voltage supply and the fifth resistor, the thirteenth and fourteenth resistors coupled to form a second junction, the fifteenth resistor coupled between the second junction and the voltage supply source;

a sixteenth resistor coupled between the voltage supply source and the fourteenth resistor;

a second OPAMP, having a second positive OPAMP input, a second negative OPAMP input, a second positive OPAMP output and a second negative OPAMP output, wherein the second positive OPAMP output provides a second positive voltage supply and the second negative OPAMP output provides a second negative voltage supply;

an intermediate positive input circuit portion coupled between the first and second OPAMPS, wherein the intermediate positive input circuit portion comprises, a seventeenth resistor coupled between the first negative OPAMP output and the second positive OPAMP input, an eighteenth resistor coupled to the first negative OPAMP output, a nineteenth resistor coupled to the eighteenth resistor, and a seventh capacitor coupled between the eighteenth resistor and the second positive OPAMP input;

an intermediate negative input circuit portion coupled between the first and second OPAMPS, wherein the intermediate negative input circuit portion comprises, a twentieth resistor coupled between the first positive OPAMP output and the second negative OPAMP input, a twenty-first resistor coupled to the first positive OPAMP output, a twenty-second resistor coupled between the twenty-first and nineteenth resistor, and an eighth capacitor coupled between the twenty-first resistor and the second negative OPAMP input;

a first feedback portion coupled between the second negative OPAMP output and the second positive OPAMP input, wherein the first feedback portion comprises, a third T-network having a twenty-third resistor, a twenty-fourth resistor, and a twenty-fifth resistor, wherein the twenty-third resistor and the twenty-fourth resistor coupled to form a third junction, the twenty-fifth resistor coupled between the third junction and the voltage supply source, a twenty-sixth resistor coupled between the voltage supply source and the twenty-fourth resistor, a ninth capacitor coupled between the first positive power supply and the twenty-sixth resistor, and a twenty-seventh resistor coupled between the twenty-sixth resistor and the second positive OPAMP input;

a second feedback portion coupled between the second positive OPAMP output and the second negative OPAMP input, wherein the second feedback portion comprises, a fourth T-network having a twenty-eighth resistor, a twenty-ninth resistor, and a thirtieth resistor, wherein the twenty-eighth resistor and the twenty-ninth resistor coupled to form a fourth junction, the thirtieth resistor coupled between the third junction and the voltage supply source, a thirty-first resistor coupled between the voltage supply source and the twenty-ninth resistor, a tenth capacitor coupled between the first negative power supply and the thirty-first resistor, and a thirty-second resistor coupled between the twenty-ninth resistor and the second negative OPAMP input; and an output circuit portion coupled to the second OPAMP, wherein the output circuit portion comprises, a thirty-third resistor coupled to the second negative OPAMP output, a eleventh capacitor coupled between the thirty-third resistor and the second positive OPAMP input to provide feedback, a thirty-fourth resistor coupled in series to the thirty-third resistor, a thirty-fifth coupled in series to the thirty-fourth resistor, a thirty-sixth resistor coupled between the thirty-fifth resistor and the second positive OPAMP output, and a twelfth capacitor coupled between the thirty-sixth resistor and the second negative OPAMP input to provide feedback.

* * * * *